United States Patent [19]

Landis

[11] Patent Number: 4,751,564

[45] Date of Patent: Jun. 14, 1988

[54] MULTIPLE WAFER SCALE ASSEMBLY APPARATUS AND FIXTURE FOR USE DURING THE FABRICATION THEREOF

[75] Inventor: Richard C. Landis, Shelton, Conn.

[73] Assignee: ITT Corporation, Nutley, N.J.

[21] Appl. No.: 859,963

[22] Filed: May 5, 1986

[51] Int. Cl.[4] ............... H01L 23/02; H01L 23/16; H01L 39/02; H01L 23/02
[52] U.S. Cl. ............................. 357/75; 357/74; 357/80; 357/81
[58] Field of Search ................. 357/74, 75, 80, 81

[56] References Cited

U.S. PATENT DOCUMENTS 4,082,394 4/1978 Gedney et al. ............... 357/74
4,578,697 3/1986 Takemae ...................... 357/74

*Primary Examiner*—Martin H. Edlow
*Assistant Examiner*—David R. Josephs
*Attorney, Agent, or Firm*—Robert A. Walsh; Thomas N. Twomey; Mary C. Werner

[57] ABSTRACT

A multiple wafer scale assembly apparatus includes first and second wafer scale assemblies connected to termination pins in such a fashion that the completed assembly is operatively self contained.

7 Claims, 2 Drawing Sheets

MULTIPLE WAFER SCALE ASSEMBLY APPARATUS AND FIXTURE FOR USE DURING THE FABRICATION THEREOF

CROSS-REFERENCE TO RELATED APPLICATIONS

This application is related to one, or more, of the following U.S. patent applications: Ser. No. 859,964, entitled PACKAGE FOR A SEMICONDUCTOR ASSEMBLY; Ser. No. 860,168, entitled HEADER FOR A WAFER SCALE ASSEMBLY; Ser. No. 859,942, entitled MULTILAYER CONNECTION FOR A SEMICONDUCTOR CHIP; Ser. No. 859,962, entitled JUMPER FOR A SEMICONDUCTOR ASSEMBLY; Ser. No. 859,961, entitled SEMICONDUCTOR INTEGRATED DEVICE HAVING REDUNDANT TERMINALS FOR DISCRETE ELECTRICAL CONDUCTORS; Ser. No. 859,940, entitled A DIRECT INTERCONNECTION FOR USE BETWEEN A SEMICONDUCTOR AND A PIN CONNECTION OR THE LIKE; Ser. No. 859,963, entitled INTERLAYER CONDUCTIVE CONNECTIONS AND METHOD FOR FORMING SAME and Ser. No. 859,938, entitled UNIVERSAL WAFER SCALE ASSEMBLY all filed on even date herewith and assigned to the assignee hereof.

BACKGROUND OF THE INVENTION

The present invention generally relates to an electronic apparatus and, in particular, relates to one such electronic apparatus including multiple wafer scale assemblies.

Wafer scale assemblies, in general, are semiconductor devices that include a number of semiconductor chips mounted on a common substrate. In many instances the substrate is a semiconductor material about the size of a semiconductor wafer having electrical connections formed thereon. The electrically conductive patterns serve to interconnect the various semiconductor chips mounted on the substrate as well as to interconnect the semiconductor substrate with terminal pads used for external connections. The terminal pads are usually connected to a plurality of pins to allow external connection to the wafer scale assembly via a corresponding plug. To date, such assemblies have been individually packaged and interconnection between two or more such assemblies has been effected by pin to pin connections external to the packages thereof. Usually these connections are accomplished using conventional techniques such as, wire wrapping.

One complicating factor of wafer scale asemblies is the means and mechanisms utilized to dissipate heat generated by the multiple chip assemblies. The heat dissipated by wafer scale assemblies often increases as the physical size of each functional chip is reduced since, as the functional chip size is reduced, larger numbers of such chips can be mounted and interconnected on a single substrate.

As overall systems increase in complexity, the interconnection of two or more such wafer scale assemblies becomes very desireable to thereby form a single electronic apparatus. As commonly known, one advantage of wafer scale assemblies is the increased operating speeds thereof due to the close proximity of the individual functional chips. This advantage can be lost when two or more such assemblies are interconnected due primarily to the length of the wire interconnections therebetween. In addition, the overall thermal dissipation considerations of a multiple wafer scale assembly apparatus become rather complex if such an apparatus is to be housed in a single package.

Consequently, a multiple wafer scale assembly apparatus that reduces the interconnection lengths between individual ones of the assemblies and avoids many of the conventional complexities of heat dissipation is clearly desireable to advance the field of very high density semiconductor assemblies.

SUMMARY OF THE INVENTION

Accordingly, it is one object of the present invention to provide a multiple wafer scale assembly apparatus that substantially overcomes the above recited difficulties.

This object is accomplished, at least in part, by a multiple wafer scale assembly apparatus including means for retaining at least one major surface of each of the first and second wafer scale assemblies together and including means for interfacing with an external connection.

Other objects and advantages will become apparent to those skilled in the art from the following detailed description read in conjunction with the appended claims and the drawings attached hereto.

DETAILED DESCRIPTION OF THE INVENTION

Figure 1:
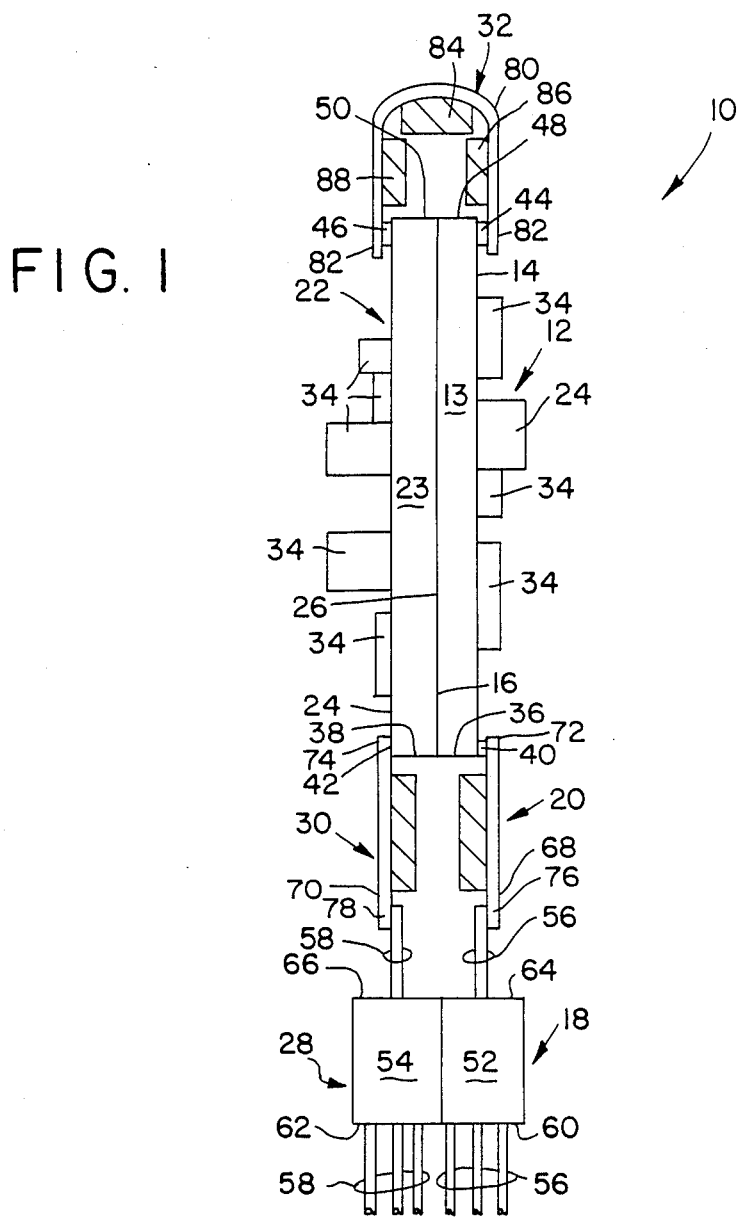
FIG. 1 is a pictorial view, not drawn to scale, of a multiple wafer scale assembly apparatus embodying the principles of the present invention.

An apparatus, generally indicated at 10 in FIG. 1 and embodying the principles of the present invention includes a first wafer scale assembly 12 including a first substrate 13 having first and second major opposing surfaces, 14 and 16, respectively, means 18 associated with the first wafer scale assembly 12 for providing external terminals thereto, first means 20 for electrically interconnecting the external termination means 18 and the first wafer scale assembly 12, a second wafer scale assembly 22 including a second substrate 23 having first and second major surfaces, 24 and 26, respectively, associated therewith, second means 28 associated with the second wafer scale assembly 22 for providing external terminals thereto, second means 30 for electrically interconnecting the external termination means 28 and the second wafer scale assembly 22 and means 32 for electrically interconnecting the first wafer scale assembly 12 with the second wafer scale assembly 22.

As used herein the phrase "wafer scale assembly" is used to designate a semiconductor device having a multiplicity of interconnected semiconductor chips mounted on a semiconductor substrate. The substrate, naturally, does not have to be the size of a semiconductor wafer as the size of such wafers vary considerably throughout the industry. Further, the actual physical size of the first and second wafer scale assemblies, 12 and 22, is not a critical factor in the understanding and practicing of the present invention.

In the preferred embodiment the first and second wafer scale assemblies, 12 and 22, respectively, each have a multiplicity of functional semiconductor chips 34 mounted on the first surfaces, 14 and 24, respectively, of the substrates, 13 and 23, respectively, thereof. In addition, each substrate, 13 and 23, respectively, includes, along a first edge, 36 and 38, respectively, thereof proximate the respective external termination means, 18 and 28, respectively, a plurality of termination pads, 40 and 42, respectively. The pads, 40 and 42, are, preferably, arranged in one or more rows. Such an arrangement is more fully described and discussed in U.S. patent application Ser. No. 859,942 filed on even date herewith and entitled MULTILAYER CONNECTION FOR A SEMICONDUCTOR CHIP. This referenced application is assigned to the assignee hereof and incorporated herein by reference.

Preferably, in the instance where the first and second wafer scale assemblies, 12 and 22, respectively, are to be interconnected, each wafer scale assembly, 12 and 22, further includes at least one row of termination pads, 44 and 46, along second edges, 48 and 50, respectively, thereof. As more fully discussed below, at least some of the termination pads, 44 and 46, distal the external termination means, 18 and 28, respectively, are, preferably, provided for interassembly interconnection.

Each of the means, 18 and 28, for providing external terminals preferably includes a molded base member, 52 and 54, respectively, each having a plurality of pins, 56 and 58, extending from a surface, 60 and 62, respectively, thereof distal the associated wafer scale assembly, 12 and 22, respectively. Alternatively, the base members, 52 and 54, can be formed as a unitary body having both pluralities of pins, 56 and 58, extending therethrough. The pins extending from the surfaces, 60 and 62, respectively, are preferably arrayed in a plurality of rows. The pins, 56 and 58, preferably, also extend through the base member, 52 and 54, respectively, and extend from the surface, 64 and 66, respectively, thereof proximate the wafer scale assembly, 12 and 22, respectively, and lie in a single plane. One typical pin arrangement is more fully described and discussed in U.S. patent application Ser. No. 860,168 filed on even date herewith and entitled HEADER FOR A WAFER SCALE ASSEMBLY. This patent application is assigned to the assignee hereof and incorporated herein by reference.

In the preferred embodiment each of the means, 20 or 30, for interconnecting the wafer scale assembly, 12 or 22, respectively, and the external termination means, 18 and 28, respectively, includes a plurality of conductive strips, 68 and 70, respectively. Each strip, 68 or 70, at one end, 72 or 74, respectively, thereof, is cooperatively sized to be affixed to the terminal pads, 40 and 42, respectively, on the wafer scale assembly, 12 or 22, respectively, and the other end, 76 or 78, respectively, thereof being cooperatively sized to the affixed to the portion of the pins, 56 and 58, respectively, proximate the wafer scale assembly, 12 or 22, respectively. Preferably, the means, 20 or 30, is of the type described and discussed in U.S. patent application Ser. No. 859,940 filed on even date herewith and entitled DIRECT INTERCONNECTION FOR USE BETWEEN A SEMICONDUCTOR AND A PIN CONNECTION OR THE LIKE. This application is assigned to the assignee hereof and incorporated herein. As discussed therein, the means, 20 or 30, prior to being affixed between the wafer scale assembly, 12 or 22, and the pins, 56 and 58, respectively, includes, for example, sprocket openings so that a strip of such means can be threaded into position for bonding in an automated mechanism.

In the particular embodiment wherein the first and second wafer scale assemblies, 12 and 22, respectively, are designed to functionally interact with each other, the apparatus 10 is provided with the wafer scale assembly interconnection means 32. The first and second wafer scale assemblies, 12 and 22, respectively, are, in such an embodiment, provided with the termination pads, 44 and 46, respectively, along a second edge, 48 and 50, respectively, thereof.

The assembly interconnection means 32 includes a plurality of conductive strips 80 having ends 82 that are cooperatively sized for attachment to the second set of termination pads, 44 and 46, respectively, of the first and second wafer scale assemblies, 12 and 22, respectively. Preferably, the interconnection means 32 is also provided with a central support member 84 affixed to the conductive strips 80. The interconnection means 32, preferably, further includes first and second side support members, 86 and 88, respectively, affixed to the conductive strips 80 on both sides of the central support member 84 and spaced apart therefrom. One such interconnection means 32 is more fully described and discussed in U.S. patent application Ser. No. 859,962 filed on even date herewith and entitled JUMPER FOR A SEMICONDUCTOR ASSEMBLY. This application is assigned to the assignee hereof and incorporated herein by reference. As discussed in the immediately above referenced patent application, the side support members, 86 and 88, respectively, are spaced apart from the central support member 84 to relieve the forces introduced when the interconnection means 32 is flexed for connection to the wafer scale assemblies, 12 and 22, respectively. For example, as shown in FIG. 1, the interconnection means 32 is shaped, for example, into the form of an inverted "U" to thereby bridge the wafer scale assemblies, 12 and 22, respectively, and allow connection to the termination pads, 44 and 46, respectively, thereof.

In one specific embodiment the first and second wafer scale assemblies, 12 and 22, respectively, include substrates, 13 and 23, respectively, that are on the order of about 8 centimeters by about 10 centimeters and about 0.05 centimeters thick. In such an embodiment the interconnection 32 means has a central support member 84 that is about 0.08 centimeters wide. The side support members, 86 and 88, are about 0.08 centimeters wide and each spaced from the central support member 84 by about 0.25 millimeters. Each of the external termination means, 18 and 28, respectively, including the molded base members, 52 and 54, respectively, have pins, 56 and 58, respectively, of about 0.25 millimeter diameter extending from the external surface, 52 and 54, distal the wafer scale assembly, 12 and 22, thereof. The pins, 56 and 58, extending from the surface, 64 and 66, proximate the wafer scale assembly, 12 and 22, respectively, are preferably about 0.25 millimeters wide and spaced on about 0.42 millimeter centers. Each of the means, 20 and 30 for electrically interconnecting the wafer scale assemblies, 12 and 22, respectively, with the external termination means, 18 and 28, respectively, includes conductive strips, 68 and 70, respectively, that are about 0.5 centimeters long.

The primary advantage of the apparatus 10 described herein is that upon assembly into a housing, not shown in the drawings, the resultant apparatus is erect. In the alternative embodiment, the base members, 52 and 54, are, in fact, a single unitary body. Such an arrangement is extremely conducive to the use of a liquid coolant housing such as that shown and described and discussed in U.S. patent application Ser. No. 859,964 filed on even date herewith and entitled PACKAGE FOR A SEMICONDUCTOR ASSEMBLY. This application is also assigned to the assignee hereof and deemed incorporated herein by reference.

In an embodiment wherein each substrate, 13 and 23, is affixed to a header, such as that described and discussed in the above referenced patent application entitled HEADER FOR WAFER SCALE ASSEMBLY, the apparatus 10 is self-supporting.

Figure 2:
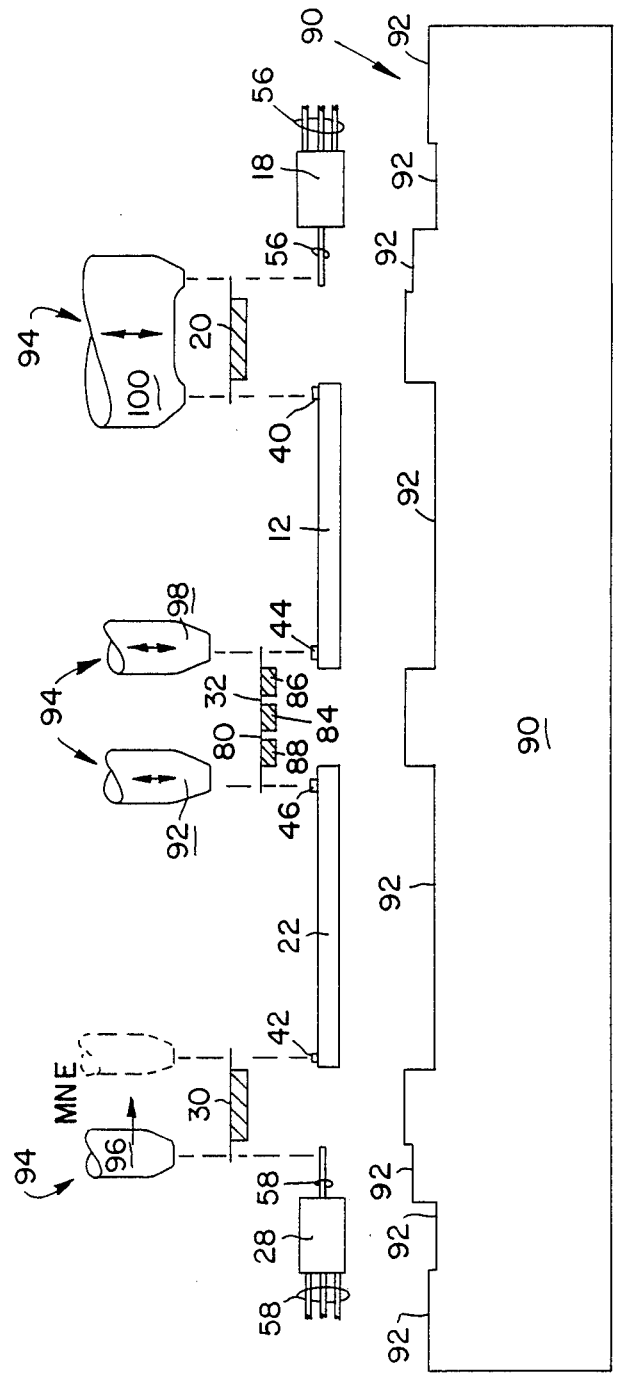
FIG. 2 is a pictorial view, not drawn to scale, of a fixture for use during the fabrication of the apparatus shown in FIG. 1.

The apparatus 10 is preferably fabricated by use of a fixture 90 shown in FIG. 2. The fixture 90 includes a plurality of recesses 92. Each recess 92 is adapted such that when all the piece parts of the apparatus 10 are positioned therein, the termination pads, 40, 42, 44 and 46, and the pins, 56 and 58, to which the interconnection means, 20 and 30, and the assembly interconnection means 32 are to be bonded all lie in a single plane. Such a fixture 90, preferably, is laterally symmetrical about the central support member 84 of the assembly interconnection means 32.

As shown, such a fixture 90 allows for the automated assembly of the apparatus 10. For example, the fixture 90 makes the automated assembly of the apparatus 10 compatible with a variety of different bonding heads 94 that bond the various interconnection means, 20 or 32, with either the terminal pads, 40, 42, 44 or 46, or the pins, 56 and 58. For example, if a single bonding head 96 is used, each bond is formed and then the bonding head is moved along the fixture. Alternatively, if a dual head bonding means 98 is provided then both ends of the interconnecting means can be bonded simultaneously. As an alternative, a double contact single bit bonding head 100 may also be provided whereby the spacing of the contact points of the bonding head 100 is such that both ends of the interconnection means, 20, 30 and 32, are bonded simultaneously. Preferably, the fixture 90 is made from stainless steel and the recesses 92 can be formed by well known machining techniques.

Although the present invention has been described herein with respect to specific embodiments and examples, it will be understood by those skilled in the art that other arrangements and configurations may be developed that, nevertheless, do not depart from the spirit and scope of the present invention. Hence, the present invention is deemed limited only by the appended claims and the reasonable interpretation thereof.

What is claimed is:

1. A multiple wafer scale assembly apparatus comprises:
    a first wafer scale assembly having a first substrate, said first substrate including first and second major opposing surfaces and first and second opposed edges, and at least one active chip affixed to said first surface;
    a second wafer scale assembly having a second substrate, said second substrate including first and second major opposing surfaces and first and second opposed edges, and at least one active chip affixed to said first surface;
    means for supplying an electrical connection between said substrates and said respective chips;
    means extending from said first edges for retaining said first and second substrates together such that said second surfaces thereof are proximate each other, said retaining means including means for providing electrical connection to said first and second wafer scale assemblies from an outside source said electrical connection means including at least one discrete base member, and a plurality of electrically conductive pins extending through each base member.

2. Apparatus as claimed in claim 1 further comprising:
    means for electrically interconnecting said first substrate with said second substrate.

3. Apparatus as claimed in claim 2 wherein said substrate electrical interconnection means includes:
    a plurality of termination pads on each said first surface of each said substrate, said termination pads being electrically connected to said active chips on said respectively substrates; and
    means for providing an electrically conductive interconnection between said plurality of termination pads.

4. Apparatus as claimed in claim 3 wherein said interconnection providing means includes:
    a plurality of conductive strips;
    a central support member, said central support member being affixed to said plurality of conductive strips; and
    first and second side support members, said first and second side support members being spaced apart by, and from, said central support members, said first and second side support members being affixed to said plurality of conductive strips.

5. Apparatus as claimed in claim 1 further comprising:
    means for joining said first and second wafer scale assemblies with said electrical connection means to provide electrical conductance therebetween.

6. Apparatus as claimed in claim 5 wherein said joining means includes:
    a plurality of terminal pads on each said first surface of each of said substrate; and
    a plurality of conductive strips connected between said terminal pads and said electrical connection means.

7. A fixture for use in fabricating a multiple wafer scale assembly; said fixture comprises:
    a base member having a plurality of recesses, said recesses being dimensioned to receive multiple wafer scale assemblies each having a plurality of bonding pads on one surface thereof and multiple external connectors, each connector having a plurality of pins extending therethrough, in a manner such that the bonding pads and the plurality of pins line in a single plane.

* * * * *